United States Patent
Dijkmans

Patent Number: 5,825,255
Date of Patent: Oct. 20, 1998

[54] OSCILLATOR STARTING CIRCUIT

[75] Inventor: Eise C. Dijkmans, Eindhoven, Netherlands

[73] Assignee: U.S. Philips Corporation, New York, N.Y.

[21] Appl. No.: 902,048

[22] Filed: Jul. 29, 1997

[30] Foreign Application Priority Data

Aug. 7, 1996 [EP] European Pat. Off. .............. 96202211

[51] Int. Cl.$^6$ ................................. H03B 5/06; H03B 5/36
[52] U.S. Cl. .................... 331/173; 331/109; 331/116 FE; 331/158; 331/183; 331/186
[58] Field of Search ..................... 331/109, 114, 331/116 R, 116 FE, 117 R, 117 FE, 117 D, 158, 173, 175, 182–183, 185–186

[56] References Cited

U.S. PATENT DOCUMENTS 5,552,751  9/1996  Cooper ............................. 331/116 FE

FOREIGN PATENT DOCUMENTS

3128331 C2  6/1982  Germany .

*Primary Examiner*—David Mis
*Attorney, Agent, or Firm*—Steven R. Biren

[57] ABSTRACT

An oscillator in which the transconductance of an amplification transistor (T0) is limited through a measurement of the potential at the input electrode (G0) of the amplification transistor (T0) by means of a differential pair (T1, T2) for safeguarding the starting of the oscillator.

20 Claims, 2 Drawing Sheets

OSCILLATOR STARTING CIRCUIT

BACKGROUND OF THE INVENTION

1. Field of the Invention

The invention relates to an oscillator comprising an amplifier which comprises a first and a second supply terminal, an amplification transistor with a first main electrode coupled to an output terminal, a second main electrode coupled to the first supply terminal, and a control electrode coupled to an input terminal; a resonator; and a starting circuit.

2. Description of Related Art

Such an oscillator is known from a German Patent document no. 3128331. The frequency of the output signal of an oscillator is often defined through the use of a piezo-electric element, for example a quartz crystal. The power supplied to the piezoelectric element must be considerable in order to start such an oscillator. The amplifier must have a high gain for this reason. To achieve this, the transconductance of the amplification transistor of the amplifier must be comparatively great. It is usual to couple a current-generating means to the control electrode of the amplification transistor. This measure may have the result that the amplification transistor is overloaded, so that the transconductance suddenly drops steeply. The oscillator is incapable of starting then. This problem is solved in the known oscillator in that the oscillator is provided with an auxiliary circuit which reduces the current supplied by the current-generating means through a voltage measurement at the output terminal of the oscillator when the potential at the output terminal of the oscillator exceeds a certain limit value. The auxiliary circuit in fact is a feedback control loop and has a measuring transistor which is coupled by its input electrode to the output terminal of the oscillator.

A disadvantage of the known oscillator is that the auxiliary circuit may exhibit an unstable control behaviour. This problem is solved in the known circuit through the addition of an extra capacitor. It is a disadvantage of this solution that an additional capacitor is necessary. This is the more disadvantageous as the oscillator is used in an integrated circuit because the chip surface area required for the oscillator is then significantly increased.

A further disadvantage of the known circuit is that the maximum achievable amplitude of the output signal at the output terminal of the oscillator is unnecessarily restricted owing to the use of the auxiliary circuit.

SUMMARY OF THE INVENTION

It is an object of the invention to provide an oscillator with a starting circuit which eliminates the above disadvantages.

An oscillator according to the invention is for this purpose characterized in that the starting circuit limits the potential at the input terminal through a measurement of the potential at the input terminal.

The invention is based on the recognition that the disadvantages of the known oscillator can be avoided if the starting circuit is not constructed as a feedback control loop but as a voltage limiter which limits the voltage at the control electrode of the amplification transistor.

An embodiment of an oscillator according to the invention is characterized in that the starting circuit comprises a differential pair consisting of a first transistor with a first main electrode coupled to the input terminal, a second main electrode coupled to current-generating means, and a control electrode coupled to a reference terminal, and of a second transistor with a first main electrode coupled to the first supply terminal, a second main electrode coupled to the second main electrode of the first transistor, and a control electrode coupled to a common terminal.

To increase the gain of the amplifier further, the amplifier may comprise a further amplification transistor with a first main electrode coupled to the output terminal, a second main electrode coupled to the second supply terminal, and a control electrode coupled to a further input terminal. The transconductance of the amplifier is equal then to the sum of the transconductances of the amplification transistor and of the further amplification transistor. To prevent the further amplification transistor from being overloaded, so that the oscillator cannot start, the oscillator should then comprise a further starting circuit. The further starting circuit may be constructed in a manner similar to that of the starting circuit.

A further embodiment of an oscillator according to the invention is characterized in that the oscillator in addition comprises an amplitude controller for controlling the amplitude of the oscillator signal at the output terminal. The amplitude controller may comprise a third transistor with a first main electrode, a second main electrode coupled to the output terminal, and a control electrode coupled to an amplitude reference terminal; a fourth transistor with a first main electrode coupled to the first main electrode of the third transistor, a second main electrode coupled to the input terminal, and a control electrode; a bias capacitor coupled between the output terminal and the control electrode of the fourth transistor; and a voltage limiter coupled between the first supply terminal and the control electrode of the fourth transistor. The amplitude of the output signal at the output terminal may be controlled by voltage-generating means coupled to the amplitude reference terminal. If the oscillator is in addition provided with the further amplification transistor, the oscillator may comprise a further amplitude controller. The further amplitude controller may be constructed in a manner similar to that of the amplitude controller. If the further amplitude controller is controlled by further voltage-generating means coupled to a further amplitude reference terminal, the positive and negative peaks of the output signal at the output terminal can be separately controlled. If so desired, the further voltage-generating means and the further amplitude reference terminal may be omitted. The further amplitude controller should then be coupled to the amplitude reference terminal. Both the positive and the negative peaks of the output signal at the output terminal are controlled / by the voltage-generating means in that case.

BRIEF DESCRIPTION OF THE DRAWINGS

The invention will be explained in more detail with reference to the accompanying drawing, in which.

DETAILED DESCRIPTION OF THE PREFERRED EMBODIMENTS

The same components or elements have been given the same reference symbols in these Figures. The transistors are constructed as field effect transistors here, by way of example, the drains, sources, and gates corresponding to the first main electrodes, the second main electrodes and the control electrodes, respectively. The transistors may alternatively be bipolar transistors. Instead of the conductivity types indicated, the transistors may alternatively be given the opposite conductivity types. A combination of bipolar transistors and field effect transistors is also possible. The polarities of voltage-generating or current-generating means are to be adapted as required. The oscillator may be realized in an integrated circuit as well as by means of discrete components.

Figure 1:
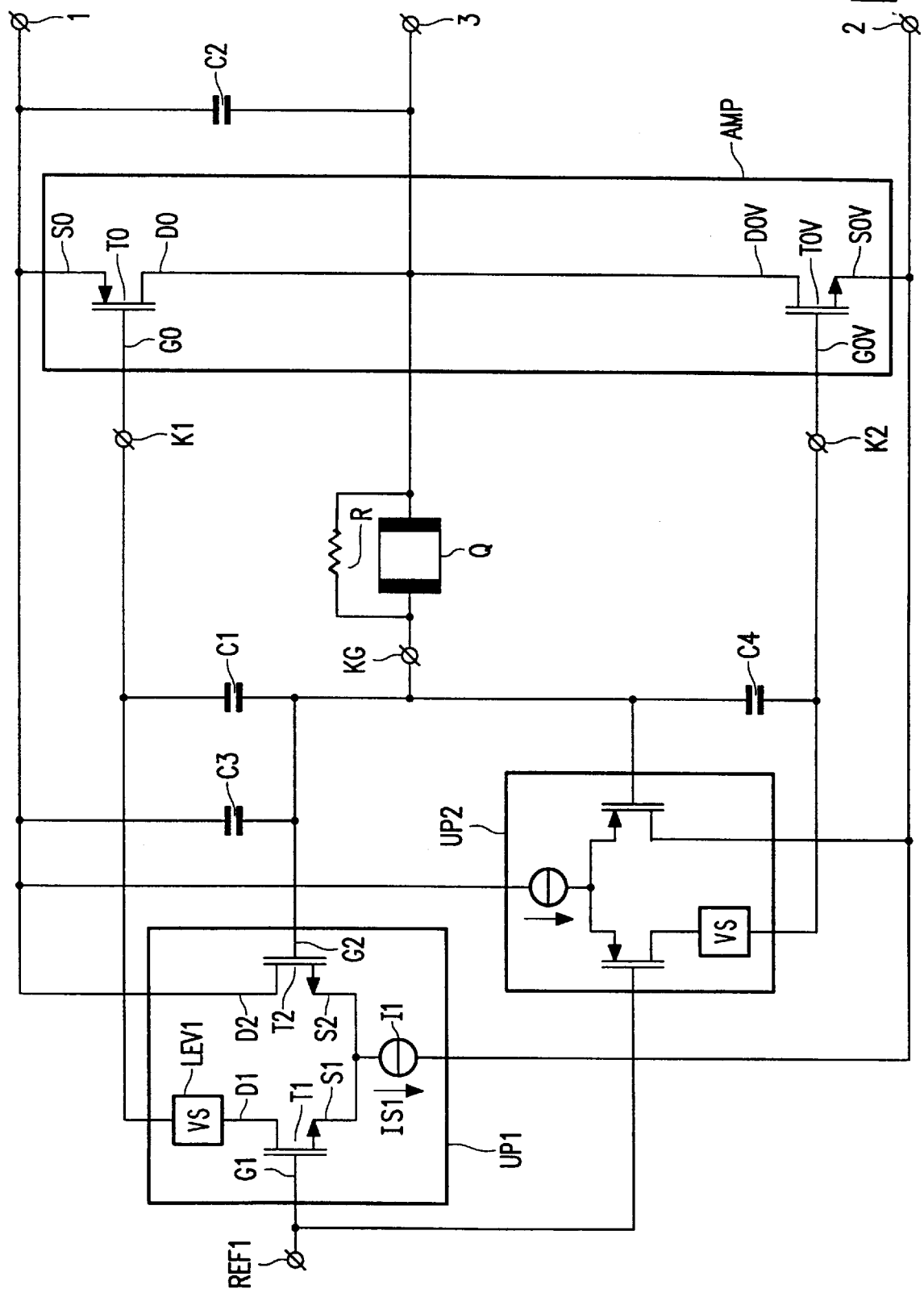
FIG. 1 is a circuit diagram of an embodiment of an oscillator with a starting circuit according to the invention.

FIG. 1 shows an embodiment of an oscillator with a starting circuit UP1 according to the invention. The oscillator comprises an amplifier AMP with a first and a second supply terminal 1, 2, an amplification transistor T0 with its drain D0 coupled to an output terminal 3, its source S0 coupled to the first supply terminal 1, and its gate G0 coupled to an input terminal K1; a resonator Q connected between the output terminal 3 and a common terminal KG; and a first capacitor C1 connected between the input terminal K1 and the common terminal KG; a second capacitor C2 connected between the output terminal 3 and the first supply terminal 1; and a third capacitor C3 connected between the common terminal KG and the first supply terminal 1. The series arrangement of the resonator Q and the first capacitor C1 forms a feedback path which together with the amplifier AMP forms a closed loop. The resonator Q is often constructed with a quartz crystal. The second and the third capacitor C2, C3 serve as phase-shifting elements so that the frequency of the oscillator is substantially equal to the resonance frequency of the resonator. If the resonator Q is constructed with a quartz crystal, the resistance losses of the quartz crystal may be so high during starting of the oscillator that the feedback path is not efficient enough. It may be necessary for this reason to connect a resistive element R parallel to the quartz crystal. This resistive element R may be constructed, for example, with a resistor or with a diode. It is also possible to couple the resistive element R between the output terminal 3 and the input terminal K1. A current-generating means or current source I1 is furthermore coupled to the gate G0 of the amplification transistor T0 for starting the oscillator. It may nevertheless occur that the oscillator fails to start. This is due to the following phenomenon. The current source I1 charges the gate-source capacitance of the amplification transistor T0 progressively, so that an increasing voltage difference arises between the source S0 and the gate G0. This brings the amplification transistor T0 progressively into the conducting state, while at the same time the transconductance of the amplification transistor T0 rises progressively. The voltage difference between the source S0 and the drain D0 will increase progressively at the same time. At a given moment, the voltage difference between the source S0 and the drain D0 is so small that the amplification transistor T0 leaves the saturated state, so that the transconductance of the amplification transistor T0 drops steeply. If the oscillator had not yet been started before this given moment, the oscillator will be incapable of starting because of an insufficient transconductance of the amplification transistor T0.

To ensure that the oscillator will start, the oscillator according to the invention is in addition provided with a starting circuit UP1 comprising a differential pair T1, T2 of a first transistor T1 with its drain D1 coupled to the input terminal K1, its source S1 coupled to the current source I1, and its gate G1 coupled to a reference terminal REF1, and a second transistor T2 with its drain D2 coupled to the first supply terminal 1, its source S2 coupled to the source S1 of the first transistor T1, and its gate G2 coupled to the common terminal KG. A voltage level shifter LEV1 may in addition be connected in series with the drain D1 of the first transistor T1.

The starting circuit UP1 operates as follows. A voltage-generating means supplies a potential to the reference terminal REF1. This potential is preferably equal to half the potential of the first supply terminal 1. Initially a certain portion of a current IS1 supplied by the current source I1 will flow through the first transistor T1. The combination of the differential pair UP1, the amplifier AMP, and the parallel arrangement of the quartz crystal Q and the resistive element R forms a negative feedback control loop, as a result of which the potential at the gate G2 of the second transistor T2 becomes substantially equal to the potential at the reference terminal REF1. As a consequence half the current IS1 accordingly flows through the first transistor T1, whereby the gate-source capacitance of the amplification transistor T0 is progressively charged, and the amplification transistor T0 becomes progressively more conducting. The voltage difference between the drain D1 and the source S1 of the first transistor T1 decreases continuously until the first transistor T1 is no longer saturated. The current flowing through the first transistor T1 decreases continuously as a result of this. Accordingly, the gate-source capacitance of the amplification transistor T0 will not, or substantially not be charged any further. Given a suitable dimensioning of the voltage level shifter LEV1, the first transistor T1 will leave the saturated state before the amplification transistor T0 could become unsaturated. It is ensured thereby that the oscillator will start.

When the oscillator is oscillating, the current IS1 flows alternately through the first and the second transistor T1, T2. Owing to the negative feedback control loop UP1, AMP, Q, R, the DC voltage components of the potentials at the common terminal KG and the output terminal 3 are equal to the potential at the reference terminal REF1.

If the oscillator is constructed with a further amplification transistor T0V which is coupled by its drain D0V to the output terminal 3; by its source S0V to the second supply terminal 2; and by its gate G0V to a further input terminal K2, the oscillator must in addition comprise a further starting circuit UP2 and a fourth capacitor C4 connected between the common terminal KG and the further input terminal K2 to ensure the starting of the oscillator. The further starting circuit UP2 can be constructed in a way corresponding to that of the starting circuit UP1.

Figure 2:
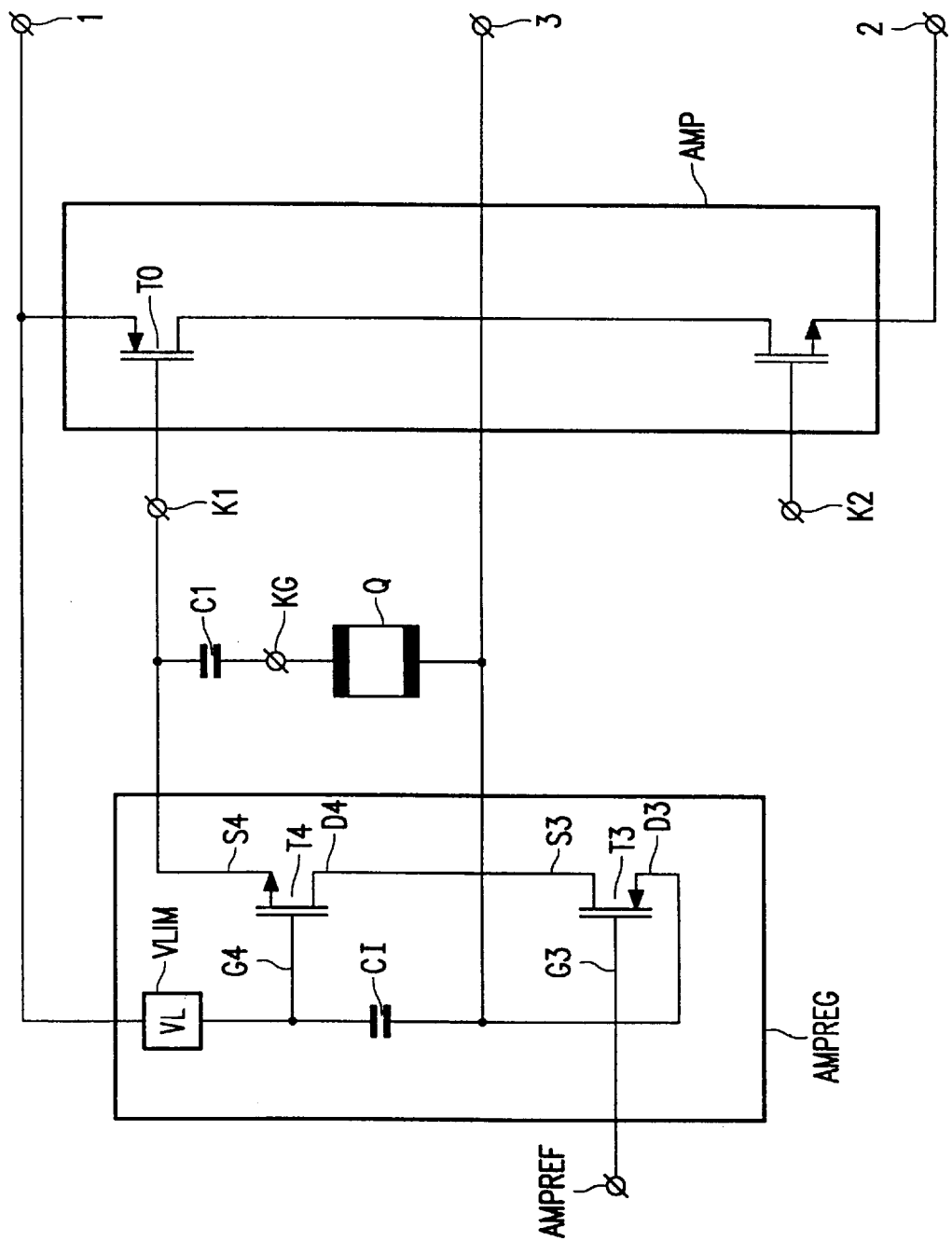
FIG. 2 is a circuit diagram of a further embodiment of an oscillator with an amplitude controller according to the invention.

FIG. 2 shows an embodiment of an amplitude controller AMPREG which may be used in the oscillator according to the invention. The amplitude controller AMPREG comprises a third transistor T3 whose source S3 is coupled to the output terminal 3 and whose gate G3 is coupled to an amplitude reference terminal AMPREF; a fourth transistor T4 whose drain D4 is coupled to the drain D3 of the third transistor T3 and whose source S4 is coupled to the input terminal K1; a bias capacitor CI coupled between the output terminal 3 and the gate G4 of the fourth transistor T4; and a voltage limiter VLIM coupled between the first supply terminal 1 and the gate G4 of the fourth transistor T4. The operation of the amplitude controller AMPREG is as follows. It is assumed by way of example that: the potential at the first supply terminal 1 is higher than the potential at the second supply terminal 2; the amplification transistor T0 and the third transistor T3 are P-type field effect transistors; and the fourth transistor T4 is an N-type field effect transistor. It is possible to control the amplitude of the positive half of the oscillator signal at the output terminal 3 by means of the amplitude controller AMPREG through the use of a voltage-generating means which supplies a voltage to the amplitude reference terminal AMPREF. When the potential at the output terminal 3 is higher than the potential at the amplitude reference terminal AMPREF by more than a threshold voltage VT3 of the third transistor T3, the third transistor T3 will become conducting, so that a current will flow from the output terminal 3 through the third and fourth transistors T3 and T4 to the input terminal K1. This causes the potential at the input terminal K1 to rise, so that the current through the amplification transistor T0 decreases. This decreases the potential at the output terminal 3 until the potential at the output terminal 3 has become so low that the potential difference between the output terminal 3 and the amplitude reference terminal AMPREF is equal to the threshold voltage VT3 of the third transistor T3. A small current flows through the third and the fourth transistor T3, T4 during the positive peaks only of the output signal at the output terminal 3; the amplitude controller UP1 accordingly carries out its control during the positive peaks of the output signal. Since the fourth transistor T4 must be conducting during the positive peaks of the output signal, it is necessary for the potential at the gate G4 to be higher than the potential at the source S4 by at least a threshold voltage VT4 of the fourth transistor T4 during the positive peaks. This is achieved through a coupling of the gate G4 to the output terminal 3 via the bias capacitor CI. Since the signal at the output terminal 3 is in counterphase to the signal at the common terminal KG, a sufficient potential difference obtains between the gate G4 and the source S4 of the fourth transistor T4 during the positive peaks of the signal at the output terminal 3, so that the fourth transistor T4 is conducting.

The voltage limiter VLIM limits the signal voltage at the gate G4 of the fourth transistor T4, so that it is prevented that the source and drain functions of the fourth transistor T4 could become interchanged, which would render it possible for a current to flow from the input terminal K1 through the fourth and third transistors T4 and T3 to the output terminal 3.

I claim:

1. An oscillator comprising:
    an amplifier which comprises:
        a first and a second supply terminal,
        an amplification transistor with
            a first main electrode coupled to an output terminal,
            a second main electrode coupled to the first supply terminal, and
            a control electrode coupled to an input terminal;
        a resonator; and
        a starting circuit, characterized in that the starting circuit limits the potential at the input terminal through a measurement of the potential at the input terminal (K1).

2. An oscillator as claimed in claim 1, characterized in that the starting circuit comprises:
    a differential pair comprising:
        a first transistor with
            a first main electrode coupled to the input terminal,
            a second main electrode coupled to current-generating means, and
            a control electrode coupled to a reference terminal, and
        a second transistor with
            a first main electrode coupled to the first supply terminal,
            a second main electrode coupled to the second main electrode of the first transistor, and
            a control electrode coupled to a common terminal.

3. An oscillator as claimed in claim 2, characterized in that a voltage level shifter is connected in series with the first main electrode of the first transistor.

4. An oscillator as claimed in claim 1, characterized in that the oscillator in addition comprises an amplitude controller for controlling the amplitude of the oscillator signal at the output terminal.

5. An oscillator as claimed in claim 4, characterized in that the amplitude controller comprises:
    a third transistor with
        a first main electrode,
        a second main electrode coupled to the output terminal, and
        a control electrode coupled to an amplitude reference terminal;
    a fourth transistor with
        a first main electrode coupled to the first main electrode of the third transistor,
        a second main electrode coupled to the input terminal, and
        a control electrode; and
    a bias capacitor coupled between the output terminal and the control electrode of the fourth transistor.

6. An oscillator as claimed in claim 5, characterized in that the amplitude controller in addition comprises a voltage limiter for limiting the potential at the control electrode of the fourth transistor.

7. An oscillator as claimed in claim 5, characterized in that the amplification transistor and the third transistor are of the same conductivity type which is opposed to the conductivity type of the fourth transistor.

8. An oscillator as claimed in claim 1, characterized in that the resonator comprises a piezoelectric element.

9. An oscillator as claimed in claim 1, characterized in that the resonator comprises a combination circuit of a capacitor and a coil.

10. An oscillator as claimed in claim 2, characterized in that the oscillator in addition comprises an amplitude controller for controlling the amplitude of the oscillator signal at the output terminal.

11. An oscillator as claimed in claim 3, characterized in that the oscillator in addition comprises an amplitude controller for controlling the amplitude of the oscillator signal at the output terminal.

12. An oscillator as claimed in claim 10, characterized in that the amplitude controller comprises:
    a third transistor with
        a first main electrode,
        a second main electrode coupled to the output terminal, and
        a control electrode coupled to an amplitude reference terminal;
    a fourth transistor with
        a first main electrode coupled to the first main electrode of the third transistor,
        a second main electrode coupled to the input terminal, and
        a control electrode; and
    a bias capacitor coupled between the output terminal and the control electrode of the fourth transistor.

13. An oscillator as claimed in claim 11, characterized in that the amplitude controller comprises:
    a third transistor with
        a first main electrode,
        a second main electrode coupled to the output terminal, and
        a control electrode coupled to an amplitude reference terminal;
    a fourth transistor with a first main electrode coupled to the first main electrode of the third transistor, a second main electrode coupled to the input terminal, and a control electrode; and a bias capacitor coupled between the output terminal and the control electrode of the fourth transistor.

14. An oscillator as claimed in claim 12, characterized in that the amplitude controller in addition comprises a voltage limiter for limiting the potential at the control electrode of the fourth transistor.

15. An oscillator as claimed in claim 13, characterized in that the amplitude controller in addition comprises a voltage limiter for limiting the potential at the control electrode of the fourth transistor.

16. An oscillator as claimed in claim 6, characterized in that the amplification transistor and the third transistor are of the same conductivity type which is opposed to the conductivity type of the fourth transistor.

17. An oscillator as claimed in claim 2, characterized in that the resonator comprises a piezoelectric element.

18. An oscillator as claimed in claim 6, characterized in that the resonator comprises a piezoelectric element.

19. An oscillator as claimed in claim 4, characterized in that the resonator comprises a combination circuit of a capacitor and a coil.

20. An oscillator as claimed in claim 16, characterized in that the resonator comprises a combination circuit of a capacitor and a coil.

* * * * *